United States Patent [19]

Banks

[11] Patent Number: 4,771,236

[45] Date of Patent: Sep. 13, 1988

[54] MULTILAYERED PRINTED CIRCUIT BOARD TYPE RESISTOR ISOLATED TRAY FOR STRESS TESTING INTEGRATED CIRCUITS AND METHOD OF MAKING SAME

[76] Inventor: Sherman M. Banks, 209 Concord Dr., Madison, Ala. 35758

[21] Appl. No.: 809,155

[22] Filed: Dec. 16, 1985

[51] Int. Cl.$^4$ ............................................. G01R 31/02
[52] U.S. Cl. ............................... 324/158 F; 324/73 R
[58] Field of Search ................. 29/825, 826, 846, 847; 324/73 R, 73 PC, 158 F, 158 P, 158 R; 338/308; 427/96, 101, 102; 339/172; 361/400, 412, 413

[56] References Cited

U.S. PATENT DOCUMENTS

| | | | |
|---|---|---|---|
| 3,628,095 | 12/1971 | Schwartz et al. | 339/17 C |
| 3,648,364 | 3/1972 | Endo | 338/308 |
| 3,753,046 | 8/1973 | Towell | 361/400 |
| 3,963,986 | 6/1976 | Morton et al. | 324/158 F |
| 3,964,087 | 6/1976 | Mallon | 338/308 |
| 4,562,092 | 12/1985 | Wiech, Jr. | 427/101 |
| 4,574,235 | 3/1986 | Kelly et al. | 324/158 F |

FOREIGN PATENT DOCUMENTS 1144767 3/1963 France ................................. 361/400

OTHER PUBLICATIONS

"Resistors on Multilayer Ceramic Substrates", by Burgess et al, IBM Tech. Disc. Bull., vol. 26, #4, Sep. 83, pp. 1973–1974.
"Semiconductor Chip Ceramic Carrier with Internal Resistors", IBM Tech. Disc. Bull., vol. 28 #3, Aug. 85, p. 1057.
"MLC Top Surface Metallurgy with Cr/SiO Resistors", IBM Tech. Disc. Bull., vol. 23, #5, 10/80, pp. 1835–1836, by Gow et al.
"Module Test Socket", by Kam, IBM Tech. Disc. Bull., vol. 22, #8A, 1/80, pp. 3148–3149.
"Impedance Terminator for AC Testing Monolithic Chips", by Bove et al., IBM Tech. Disc. Bull., vol. 15, #9, 2/73, pp. 2681–2682.
"Multilayer Circuit Board", by Cannizzaro et al., IBM Tech. Disc. Bull., vol. 13, #7, 12/70, p. 2075.

Primary Examiner—Reinhard J. Eisenzopf
Assistant Examiner—W. Burns
Attorney, Agent, or Firm—George J. Porter

[57] ABSTRACT

An improved apparatus for stress testing a plurality of electronic circuits each formed on a wafer-like chip along at least one edge thereof and comprising a separate socket (60 of FIG. 1) having a set of contacts for receiving and holding one of the wafers with the set of contacts making contact with the edge contacts of the wafer it is holding and a plurality of terminal pins which are connected to the wafer edge contacts through the set of contacts and with the terminal pins of each socket being arranged in identical patterns. The apparatus comprises a multilayered printed circuit board (FIG. 4) having a plurality of identical groups of conductively plated holes (PTHs) (FIG. 15) formed therein for each socket and with each group of PTH's comprising the plurality of pin terminal holes (FIG. 15) arranged to receive the terminal pins of one of the sockets and a plurality of via holes (FIG. 15) formed therein around each socket to provide conduction between layers of said multilayered board for each socket and further with the via holes of each group of PTHs being of identical patterns, a plurality of printed circuit resistors (154 of FIG. 15) formed in one or more layers of the multilayered printed circuit board with each resistor being connected between a pin terminal hole and a via hole of the group of holes of each socket and exclusive of any other pin terminal hole or via hole with respect to connecting a resistor therebetween. Also provided is a plurality of conductive leads (lead 172 of FIG. 19 and lead 208 of FIG. 20) for connecting together the corresponding via holes of each of the sockets, and the corresponding via holes of each of the sockets, a plurality of signal sources (signal sources 1, 2, and 8 of FIG. 12) for supplying a unique signal to each group of corresponding via holes via a unique one of the conductive means, and a voltage source (+VCC and PGA of FIG. 12) for providing a common voltage source on a selected layer of the multilayered printed circuit board between selected ones of the plated through holes of each socket.

9 Claims, 23 Drawing Sheets

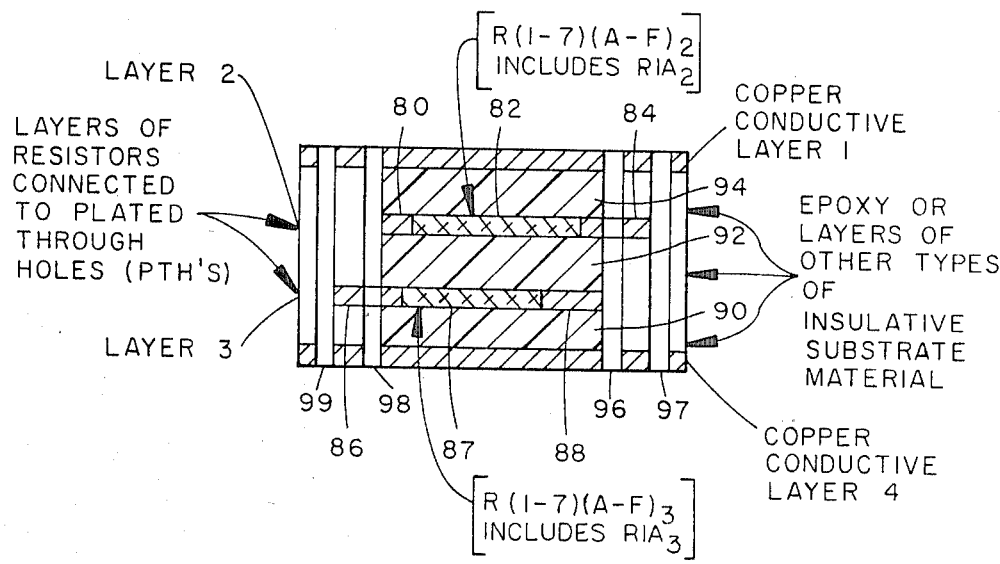

LAYER 1 → VIA AND PIN HOLES PLUS HORIZONTAL CONDUCTIVE TRACES CONNECTING CORRESPONDING VIA HOLES IN X COORDINATE IN EACH SOCKET SET OF PTH'S.

LAYERS 2 AND 3 → VIA AND PIN HOLES PLUS RESISTORS EACH CONNECTED BETWEEN A VIA AND A PIN HOLE IN EACH SOCKET SET OF PTH'S.

LEGEND →

LAYER 4 → VIA AND PIN HOLES PLUS VERTICAL CONDUCTIVE TRACES CONNECTING CORRESPONDING PIN HOLES IN Y COORDINATE IN EACH SET OF SOCKET PTH'S PLUS POWER CARRYING TRACES.

FIG. 4

| FIG. 5 CHIP A | FIG. 7 CHIP C | FIG. 9 CHIP E |
| --- | --- | --- |
| FIG. 6 CHIP B | FIG. 8 CHIP D | FIG. 10 CHIP F |

OVERLAY 2

THE SOCKET HOLDER ARRANGEMENTS IN CHIP AREAS A, B, AND C IN FIGS. 13, 14, 15, 16, 17, AND 18 ARE THE SAME AS IN CHIP AREA D.

LAYER 1

LAYER 1

LAYER 2

LAYER 2

OVERLAYER 2

LAYER 3

LAYER 3

OVERLAYER 3

LAYER 4

MULTILAYERED PRINTED CIRCUIT BOARD TYPE RESISTOR ISOLATED TRAY FOR STRESS TESTING INTEGRATED CIRCUITS AND METHOD OF MAKING SAME

BACKGROUND OF THE INVENTION

This invention relates generally to the stress testing of integrated circuits (IC's) by applying higher-than-normal voltages and/or temperatures to them over a period of several days in specially designed burn-in trays [which are actually specially designed printed circuit boards (PCBs)] which are placed in an oven and subjected to higher-than-normal voltages and/or temperatures, and more particularly to an improved multilayered PCB tray design which permits the testing of almost twice as many IC's in a given sized oven as was possible with prior art trays.

In the prior art devices the IC's are inserted in individual sockets which in turn have pin terminals which plug into the burn-in tray. The prior art devices employ a plurality of discrete current limiting resistors which isolate the various IC terminals from an exciting signal or stress voltage. The number of discrete resistors required for each IC will vary with different IC's but a typical number might be of the order of 12-16 such resistors for each IC.

Since there are usually a large number of IC's mounted on each PCB tray, for example from 100 to 250 IC's per tray, it can be seen that the number of discrete resistors can be quite large, of the order of 1200 to 4000, each of which must be hand-wired in place between a terminal in the tray, and a socket terminal which is connected to an IC terminal. The cost of such a large number of resistors per tray, and there can be many such trays being tested simultaneously, plus the labor cost of hand wiring each resistor in place amounts to a sizable increase in the cost of stress testing the IC's. In addition the cost of each oven is of the order of $60,000 to $80,000 which is substantial even when it is considered that each oven has a life expectancy of several years.

An example of the prior art method of stress testing IC's is shown in one of the figures of the present specification.

It can be seen that the use of discrete isolating resistors is not only costly from a viewpoint of materials and labor but also limits the number of IC's that can be stress tested on a single tray because of the space required for the discrete resistors.

The prior art shown in one of the figures herein is made by EG and G Wakefield Systems of Wakefield, Massachusetts. Further information regarding this prior art technique can be obtained from the Wakefield Systems Company, including information concerning the type IC's that are stress tested by the prior art technique described generally above but also the number of each different type of IC that various type trays will hold.

BRIEF STATEMENT OF THE INVENTION

In one preferred form of the invention there is provided an improved apparatus for stress testing a plurality of electronic circuits each formed on a wafer-like chip along at least one edge thereof and comprising a separate socket comprising two parallel rows of contacts for receiving and holding one of the wafers with the parallel rows of contacts making contact with the edge contacts of the wafer it is holding and a plurality of terminal pins which are connected to the wafer edge contacts through the parallel rows of contacts and with the terminal pins of each socket being arranged in identical patterns, a multilayered printed circuit board having a plurality of identical groups of conductively plated holes formed therein for each socket and with each group of plated through holes commmprising a plurality of pin terminal holes arranged to receive the terminal pins of one of the sockets and a plurality of via holes formed therein around each socket to provide conduction between layers of the multilayered board for each socket and further with the via holes of each group of plated through holes being of identical patterns (i.e., being correspondingly positioned), a plurality of printed circuit resistors formed in one or more layers of the multilayered printed circuit board with each resistor being connected between a pin terminal hole and a via hole of the group of holes of each socket and exclusive of any other pin terminal hole or via hole with respect to connecting a resistor therebetween, a plurality of conductive means for connecting together the corresponding (or correspondingly positioned) via holes of each of the sockets, and a plurality of signal sources for supplying a unique signal to each group of corresponding via holes via a unique one of the conductive means, and a voltage source for providing a common voltage source on a selected layer of the multilayered printed circuit board across selected ones of the pin terminal holes and the via holes of the plated through holes of each socket.

BRIEF DESCRIPTION OF THE DRAWINGS

FIG. 4 shows a structure similar to that of FIG. 3 but after certain levels have been combined during the processing of the present invention;

FIGS. 5, 6, 7, 8, 9, and 10, when considered together as shown in FIG. 11, show a detailed drawing of the chip circuits for six chips and their interconnections for all four layers;

FIG. 11 shows how FIGS. 5-10 are to be considered together;

FIG. 19 shows a six chip circuit section of layer 1 with the circuit traces drawn in;

FIG. 20 shows a four chip circuit section of layer 4 with the circuit traces including the power buses drawn in;

DETAILED DESCRIPTION OF THE INVENTION

A—General Discussion of the Invention (FIGS. 1-12)

Because of the complexity of this invention and the several various aspects thereof the specification will be arranged in accordance with the following outline.

I—BACKGROUND OF THE INVENTION
II—BRIEF STATEMENT OF THE INVENTION
III—BRIEF DESCRIPTION OF THE DRAWINGS
IV—DETAILED DESCRIPTION OF THE INVENTION
   A—GENERAL DISCUSSION OF THE INVENTION (FIGS. 1-12)
   B—DETAILED DESCRIPTION OF EACH LAYER (FIGS. 13-20)
   C—DETAILED DESCRIPTION OF THE PROCESS OR PROCESSES BY WHICH EACH OF LAYERS 1-4 ARE FORMED (FIGS. 13-30)
     1—Process For Forming Layers 2 and 3.
     2—Process for Forming Layers 1 and 4.
   D—DETAILED DESCRIPTION OF FIGS. 21-30

Figure 1:
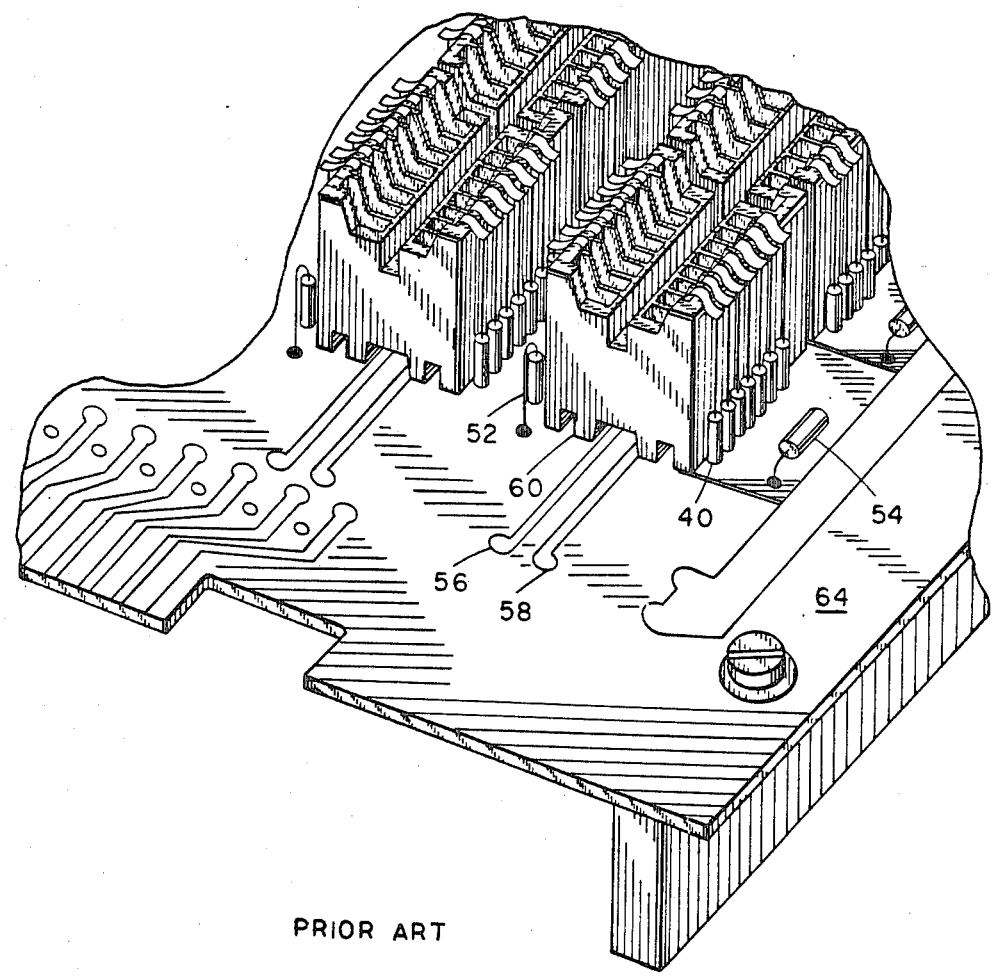
FIG. 1 shows a prior art structure of an IC burnin tray (PCB) for IC's.

Referring now to FIG. 1 there is shown an example of the prior art obtainable from the Wakefield Co. and employing discrete resistors such as the two groups of seven discrete resistors each 40 which are positioned in a row on each side of the socket holder 60. As can be seen each of these 14 discrete resistors for each integrated circuit (IC) chip socket holder 60. Elements 54 and 52 are capacitors connected between the positive and negative power supply buses 56 and 58 which extend the entire length of the PCB 64.

Figure 2:
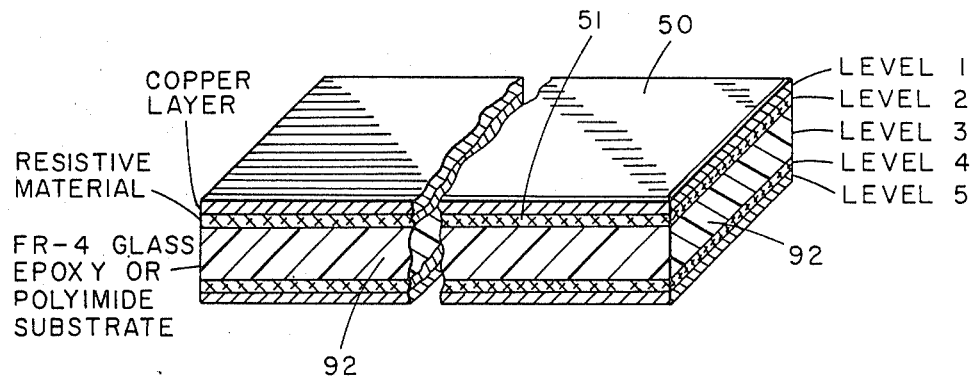
FIG. 2 shows a prior art strucutre obtainable from Ohmega Technologies Inc. and which can be used as a starting structure for the present invention.

The process of making the invention begins with the making or buying an unprocessed printed circuit board (PCB) shown in FIG. 2 which is known in the art and can be purchased from Ohmega Technologies, Inc. of 4031 Elenda Street, Culver City, Calif, and is described in detail in brochure published by the Ohmega Co. and entitled "Planar Resistor Technology", and incorporated herein by reference.

This basic unprocessed circuit board consists of five levels of which levels 1 and 5 are of copper 50, levels 2 and 4 are of a resistive material 51, and level 3, and labeled by reference character 92, is of an epoxy such as FR-4 glass epoxy or a polyimide, both of which are insulative materials and form excellent PCB substrates, but not necessarily limited to either of these materials.

It is to be noted that the term "levels" has been used in FIG. 2 rather than the term "layer" since the term "layer" will be used in describing the final product and during the process of making the final product.

Figure 3:
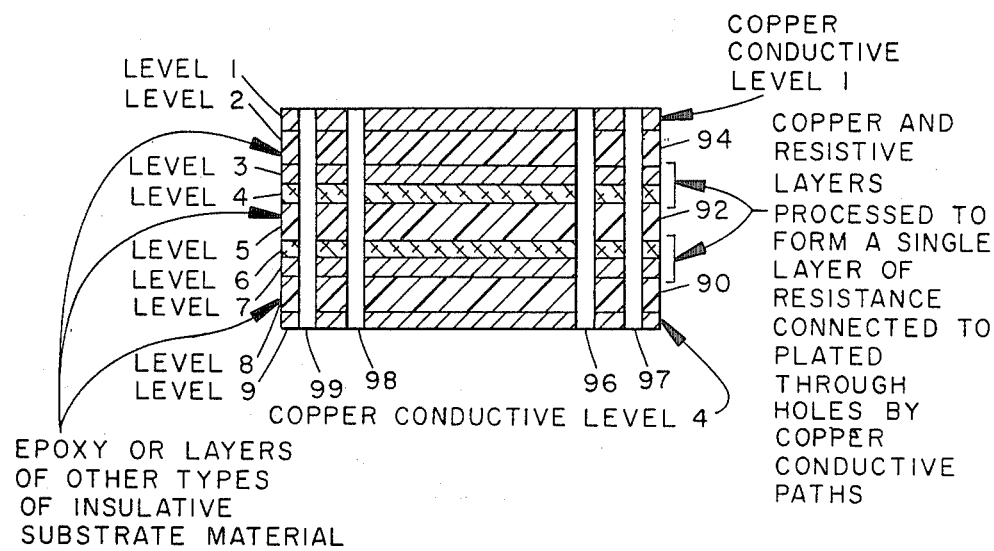
FIG. 3 shows a complete (but unprocessed) multilayered structure which, by proper processes thereof, layer by layer, will result in the present invention.

FIG. 3 shows a multilevel unprocessed PCB (that will never actaully exist either in the process of making the final product or in the final product) but which shows nine separate unprocessed levels including four levels added by the invention, four of which are divided into two levels with each pair of two levels forming a single layer of resistors which are connected to conductively plated through holes (PTH's) such as holes 96, 97, 98, and 99 by conductive strips of copper. These four levels are also identified as levels 3 and 4 and levels 6 and 7. The legend giving the composition of each level is also shown in FIG. 3.

FIG. 4 shows the results of combining levels 3 and 4 and 6 and 7 of FIG. 3 to form what will hereinafter be referred to as "layers" 2 and 3, rather than as "levels". Thus, in FIG. 4 the insulative levels 90, 92, and 94 will not be referred to as "layers" but only as insulative levels with insulative level 92 being the main substrate of the entire PCB. The layers 2 and 3 of FIG. 4 are almost identical except that they connect resistors between different pairs of holes. In layer 2, the conductive sections 80 and 84 connect resistor 82 between PTH's 98 and 97 whereas in layer 3 the conductive sections 86 and 88 connect the resistor 87 between PTH's 99 and 96.

It is significant to note that in the final product only one resistor is connected between any pair of PTH's and that both PTH's of each pair such pair of PTH's is completely exclusive of any other pair of PTH's with respect to the connection of a resistor therebetween.

FIG. 4 also has a LEGEND associated therewith which states generally what each layer contains.

Figure 5:
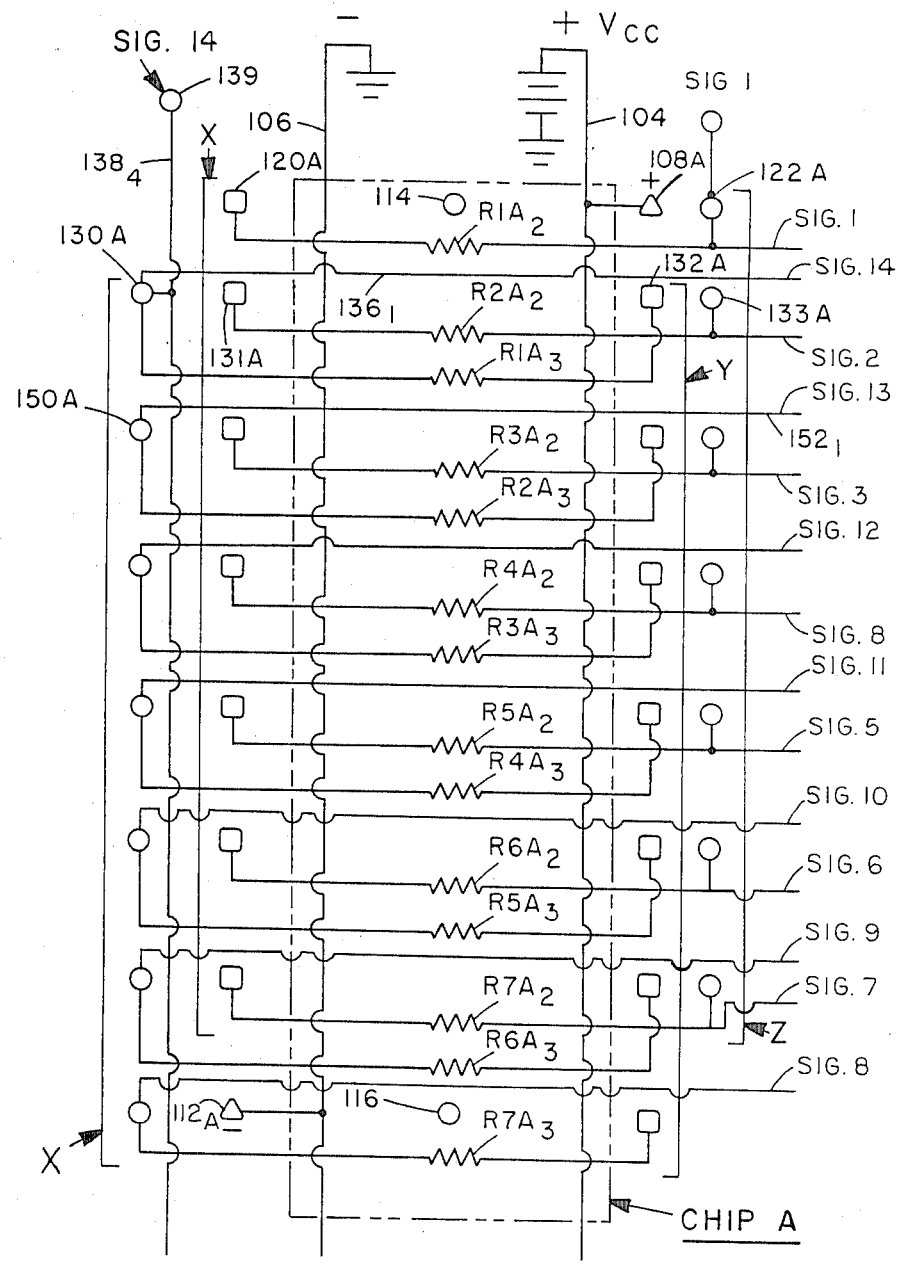
FIG. 5 is a simplified schematic drawing of a portion of the invention to facilitate an easier understanding thereof.
Figures 6, 11:
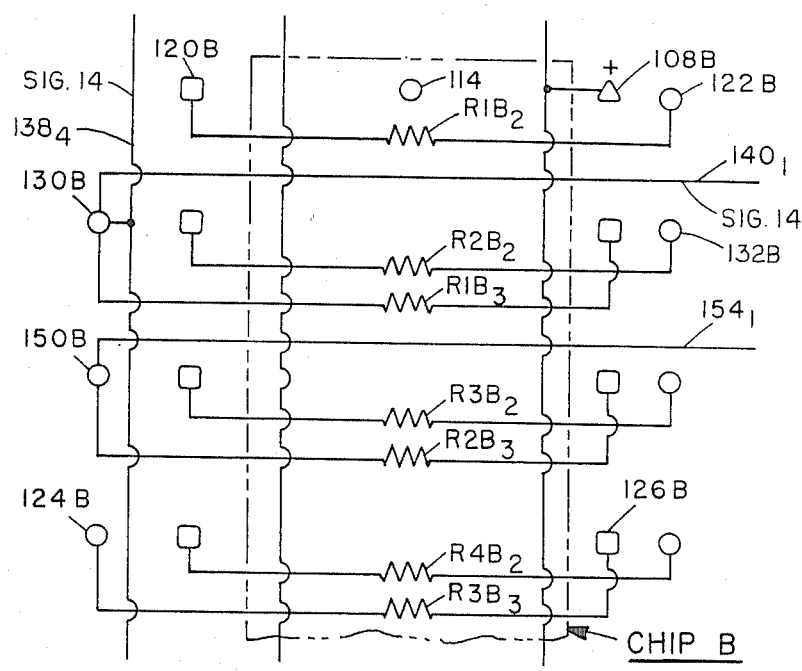
Figure 8:
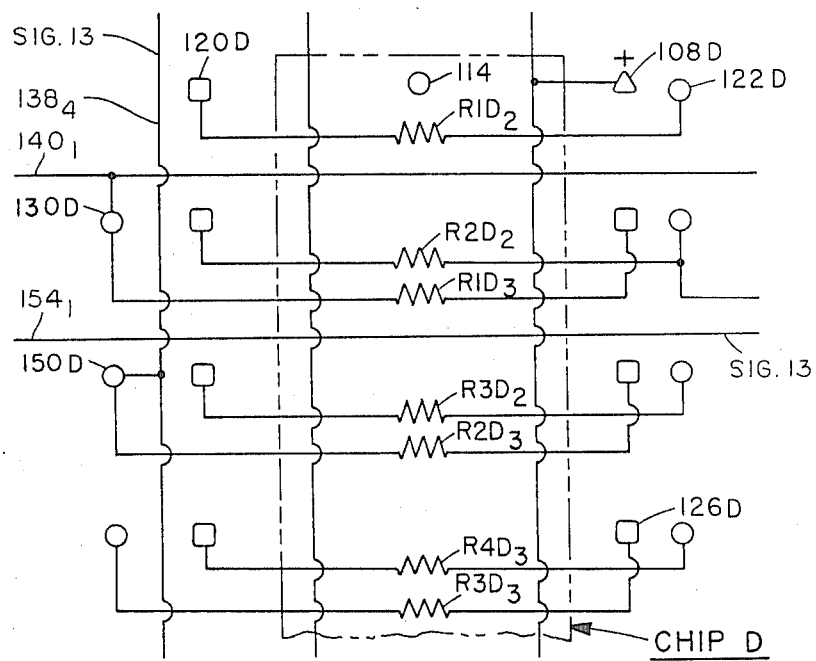
Figure 10:
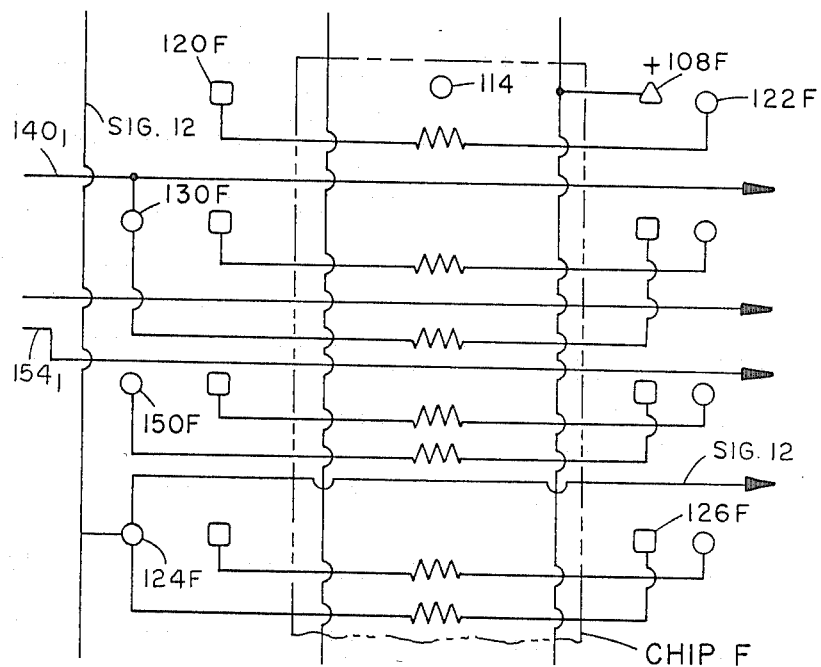

FIGS. 5-10 (as placed together as shown in FIG. 11) show a representation of the four layers 1, 2, 3, and 4 in a two dimensional drawing. In FIGS. 5-10 chip sockets and the associated and electrical interconnections for six chips are shown and represented as chip A, (FIG. 5) chip B, (FIG. 6) chip C, (FIG. 7) chip D, (FIG. 8) chip E, (FIG. 9) and chip F (FIG. 10). The circuits and interconnections for each chip are the same and, while each chip is shown in a two dimensional drawing they actually lie in three dimensions as will become clearer from the following discussion.

The complete circuits for a chip are shown only for chips A, C, and E with the resistors being labeled only in the circuits for chips A, B, C, and D.

To simplify the reference character notation corresponding elements for each chip circuit are identified by the same reference character followed by the capital letter designating the chip with which the element is associated. Thus, for example, the "A" following the numeral "120" to form the reference character 120 A indicates that the square hole 120 A is a terminal for the chip circuit of chip circuit A. The corresponding square holes in chip circuits B, C, D, E, and F are designated by reference characters 120 B, 120 C, 120 D, and 120 E, respectively.

Figure 23:
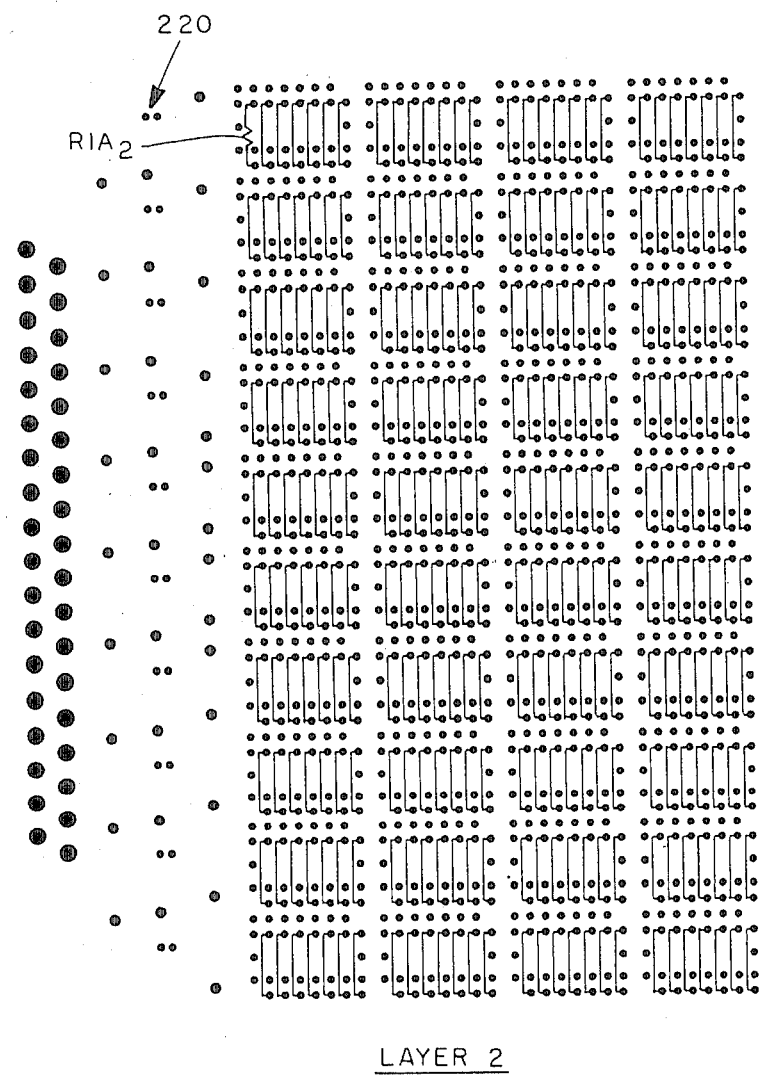
FIGS. 23 and 24 show the two end portions of layer 2 of the finished product.

Similarly, the resistor designating reference character $R1A_2$ means that resistor $R1A_2$ is in chip circuit A (the capital letter A) is a resistor R1 of a group of seven resistors ($R1A_2$-$R7A_2$), and lies in the second layer of the PCB (see FIGS. 4, 5, and 23).

Corresponding resistors in chip circuits B-F are represented by reference characters $R1B_2$, $R1D_2$, $R1E_2$, and $R1F_2$ (see FIG. 4).

As another example the resistor R3A$_3$ is a resistor R in chip circuit A and lies in the third layer of the PCB as indicated by the subscript 3 (see FIGS. 4, 5, 6, and 26).

The reference characters designating the plus and minus power supply inputs (triangular Δ in shape) to the chip circuits have similar notation. Thus, the positive power supply (represented by a triangular symbol Δ) is designated by the reference character 108A of chip circuit A and lies in level 1. The negative power supply terminal for chip circuit A (also a triangularly shaped Δ terminal) is designated as 112 A, and lies in level 1. The positive power supply terminals for chip circuits B-F are 108B, 108C, 108D, 108E, and 108F and the negative power supply terminal for chip circuits B-F are designated, respectively, 112B, 112C, 112D, 112E, and 112F.

The square shaped (□) holes and the two triangularly shaped (Δ) terminals are pin holes and they all receive a pin terminal of the chip socket holder. The round shaped (0) holes are all via holes. The walls of all the holes are conductively plated through the entire PCB.

Each via hole is electrically connected to the corresponding via holes in all of the sets of socket holes. Thus, all via holes 130 (A-E) are connected together in the following manner. Via hole 130A (FIG. 5) is connected to via holes 130C (FIG. 7) and 130E (FIG. 9) thorugh horizontal common lead 136 (FIG. 5, layer 1), and is also connected to via hole 130B through common lead 138$_4$ (in layer 4) which in turn is connected to via holes 130D (FIG. 8) and 130F through horizontal common lead 140, (in layer 1). The subscript of each lead reference character such as subscript 4 in the reference character 138$_4$ means that lead 138 lies in layer 4, as do all the subscripts representing the layer containing the described element. A number of test signals are supplied to the various socket via holes provided for each chip. More specifically, there are 14 of such signals (FIGS. 1-14) for each chip of which only FIGS. 1, 2, 8, 12, 13, and 14 are shown or simply generally indicated and which are each supplied to a particular one of the 14 via holes of each socket.

Figure 12:
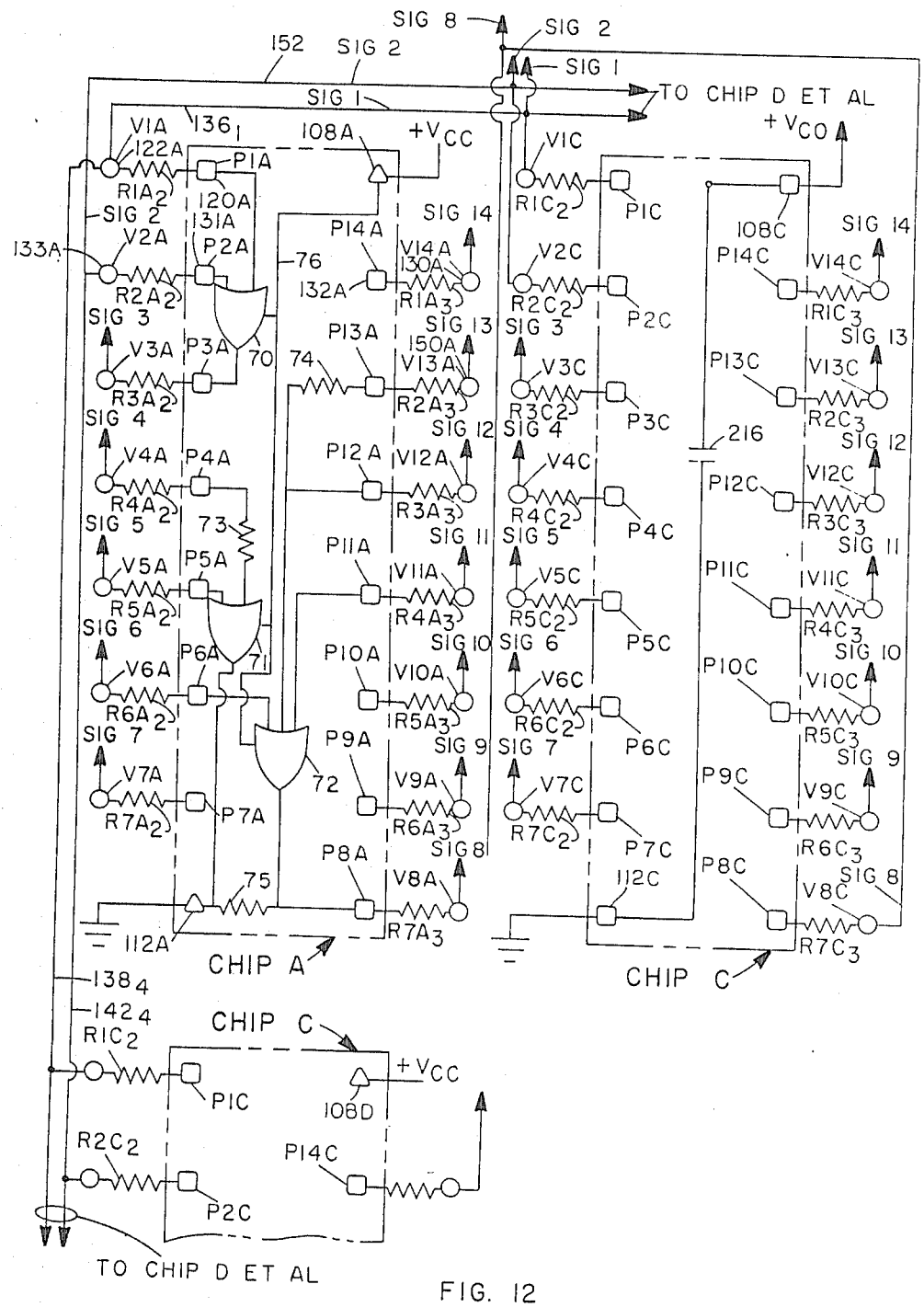
FIG. 12 shows a somewhat more detailed drawing of the circuit covering two full chip circuits and part of a third chip circuit.

It is to be understood that FIGS. 5-10 are to be read in conjunction with FIG. 12 in order to more easily understand where the various 14 test signals are supplied to the 14 via circular holes of FIGS. 5-10. It will be noted that for chip A in FIG. 12, beginning at the upper left hand corner of FIG. 12, the FIG. 1 through R1A$_2$ and increases in designation as FIGS. 2, 3, 4, --- 7 down the left side of FIG. 12, flowing through test resistors R2A$_2$, R3A$_2$, --- R7A$_2$, respectively. The test signals then proceed from the bottom of the left side of FIG. 12 upwardly, beginning with FIG. 14, and flowing through test resistors R7A$_3$ to R14A$_3$, respectively.

The foregoing arrangement of FIG. 12 is not employed in FIGS. 5-10. In FIGS. 5-10, for purposes of simplicity in illustrating the level in which the various ones of the 14 resistors (R1A$_2$-R7A$_2$) and (R1A$_3$-R7A$_3$) are all shown, one above the other and lying under the dotted rectangular rectangle labeled CHIP A. This arrangement of FIGS. 5-10 has resulted in all of the FIGS. 1-14 starting with FIG. 1 at the upper right hand corner of FIG. 5, for example, and extending downwardly in the following order; FIGS. 1, 14, 2, 13, 3, 12, 4, 11, 5, 10, 6, 9, 7, and 8 to the lower right hand corner of FIG. 5.

FIG. 12 will be discussed in more detail later herein.

Figure 7:
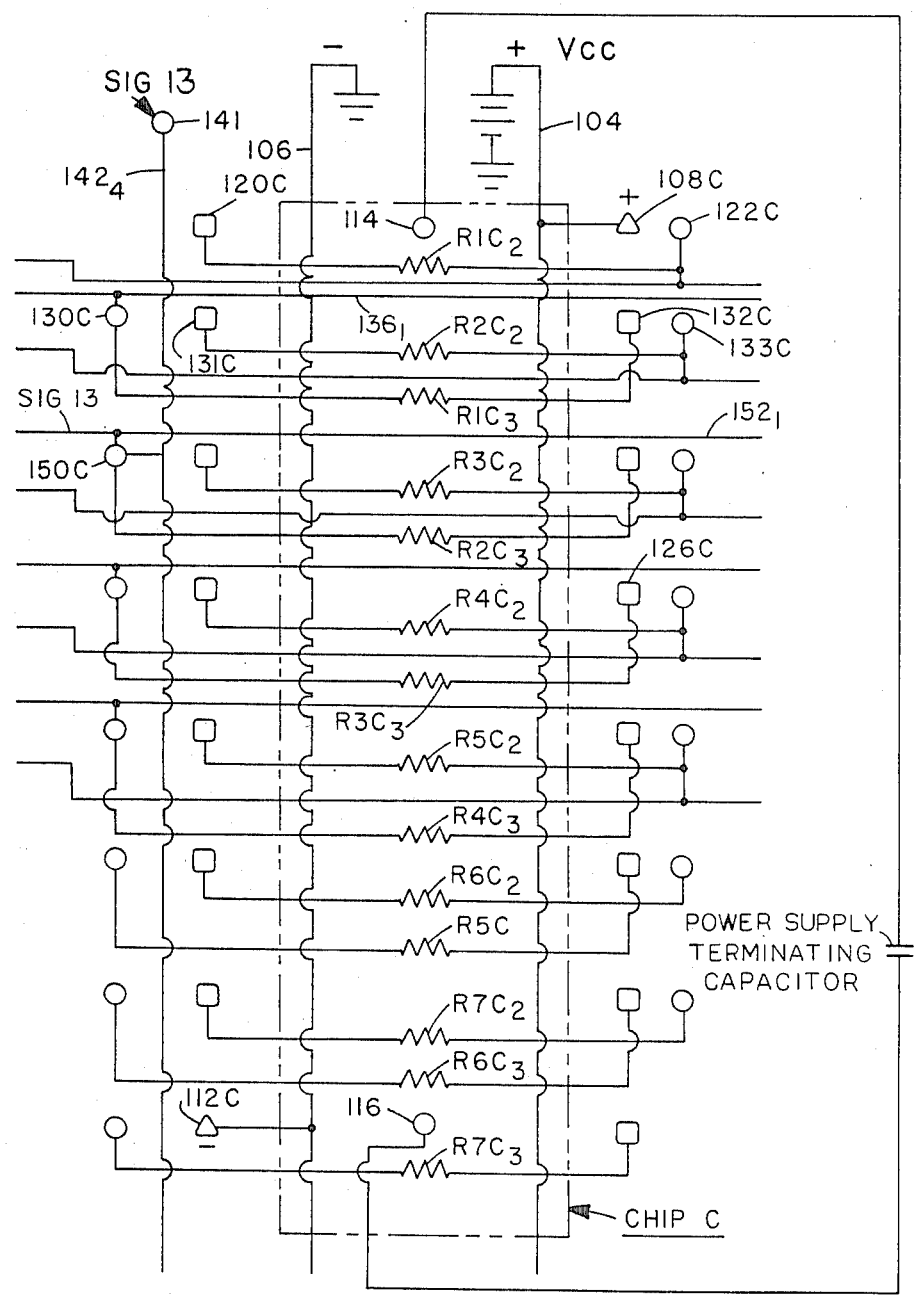

As an example, FIG. 13 of FIG. 7 is supplied to terminal 141 (FIG. 7) and thence to vertical lead 142$_4$ which connects to all via holes 150 (A-E) as follows: to via holes 150A (FIG. 5) and 150B (FIG. 7) through vertical lead 142$_4$ (FIG. 7) and then to via holes 150C (FIG. 7) and 150E (FIG. 9) through horizontal lead 152, and to via holes 150D and 150F through horizontal lead 154.

In a similar manner the remaining FIGS. 1-12 and 14 are individually supplied to each of the remaining 13 via holes within brackets X and Z of chip socket A of FIG. 5 and the corresponding via holes of each of the. rest of the chips sockets in the prior art assembly shown in FIG. 1. Any reasonable number of chip sockets, up to several hundred, can be connected together in the manner of chips A-F shown in FIG. 11 on a single multilayered print circuit board (MLPCB) of the present invention.

The two PTH's 114 and 116 (FIG. 5) in each chip circuit are + and − terminals for the power supply and a capacitor (not shown in FIG. 5 but shown un FIG. 30, for example) is connected thereacross for each chip circuit.

As suggested above, each of the signals (FIGS. 1-14) will pass through one of the 14 resistors R(1-7) (A-E)$_2$ and R(1-7)$_3$ (A-E)$_3$ of each of the chips A-E. Thus, as another example, FIG. 14 (FIG. 5) will flow from input terminal 139 through lead 138$_4$, via hole 130A, resistor R1A$_3$, pin hole 132A and into chip A. FIG. 1 will also flow through lead 136$_1$ to via holes 130C (FIG. 7) and 130E (FIG. 9), through resistors R1C$_3$ and R1E$_3$ (FIG. 7), respectively, to pin holes 132C and 132E, respectively, and then into chips C and E, and also through via holes 130B, 130D and 130F, then through resistors R1B$_3$ (FIG. 6), R1D$_3$ (FIG. 8), and R1F$_3$ (FIG. 10), respectively, and then to pin holes 132B, 132D, and 132F, respectively, and then into chips B, D, and F, respectively.

Referring now to FIG. 12 there is shown a somewhat more condensed and detailed form of FIGS. 5-10. In FIG. 12 only 3 chips A, B, and C are shown. However, in FIG. 12 the isolating or test current limiting resistors R(1-7) (A-C)$_2$ and $_3$ are shown as lying outside chips A, B, and C, and the pin holes P(1-14) (A-C) are shown as lying inside the chips A, B, and C, which, of course they do not in the actual PCB product. The pin holes lie on the PCB surface and supply socket holes for the socket terminal pins.

The arrangement of FIG. 12 does, however, show a typical logic or circuitry that might exist on a chip being tested. For example, in FIG. 12 chip A shows an arrangement of AND gates 70, 71, and 72, and their inputs from various pin hole terminals, and also shows resistors 73, 74, and 75 as well as illustrating possible connections of the positive battery source 108A (+Vcc) to AND gates 70, 71, and 72 and the negative or ground terminal 112A.

FIG. 12 also shows the connection of corresponding via holes of each chip to an individual signal source. Thus, via holes V1 (A-C) are all connected to a common signal source FIG. 1 via vertically shown lead 138$_4$ and horizontally shown lead 136$_1$. Simiarly, via holes V2 (A-C) are all connected to common signal source FIG. 2 via vertically shown lead 142$_4$ and horizontally shown lead 152$_1$.

DETAILED DESCRIPTION OF EACH LAYER (FIGS. 13-20)

In FIGS. 13-20 there is shown a small section of 4 to 6 chip socket holder pin holder arrangements for each of the four layers of the 4 layered PCB, plus 2 illustrations of overlays required in the manufacturing process for forming resistors in final layers 2 and 3. In each of FIGS. 13–20 only the socket holder pin terminal holder arrangement for the chip labeled chip D will be discussed since it is believed that will be sufficient to enable the reader to understand the similar arrangements in the other chip socket pin holder arrangements shown.

Figure 13:
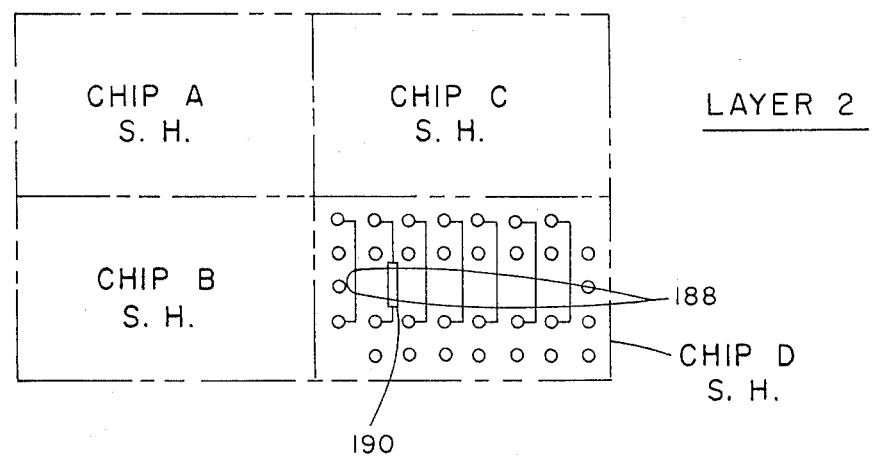
FIG. 13 shows a four chip circuit section of layer 2 before the resistors are formed therein.
Figure 9:
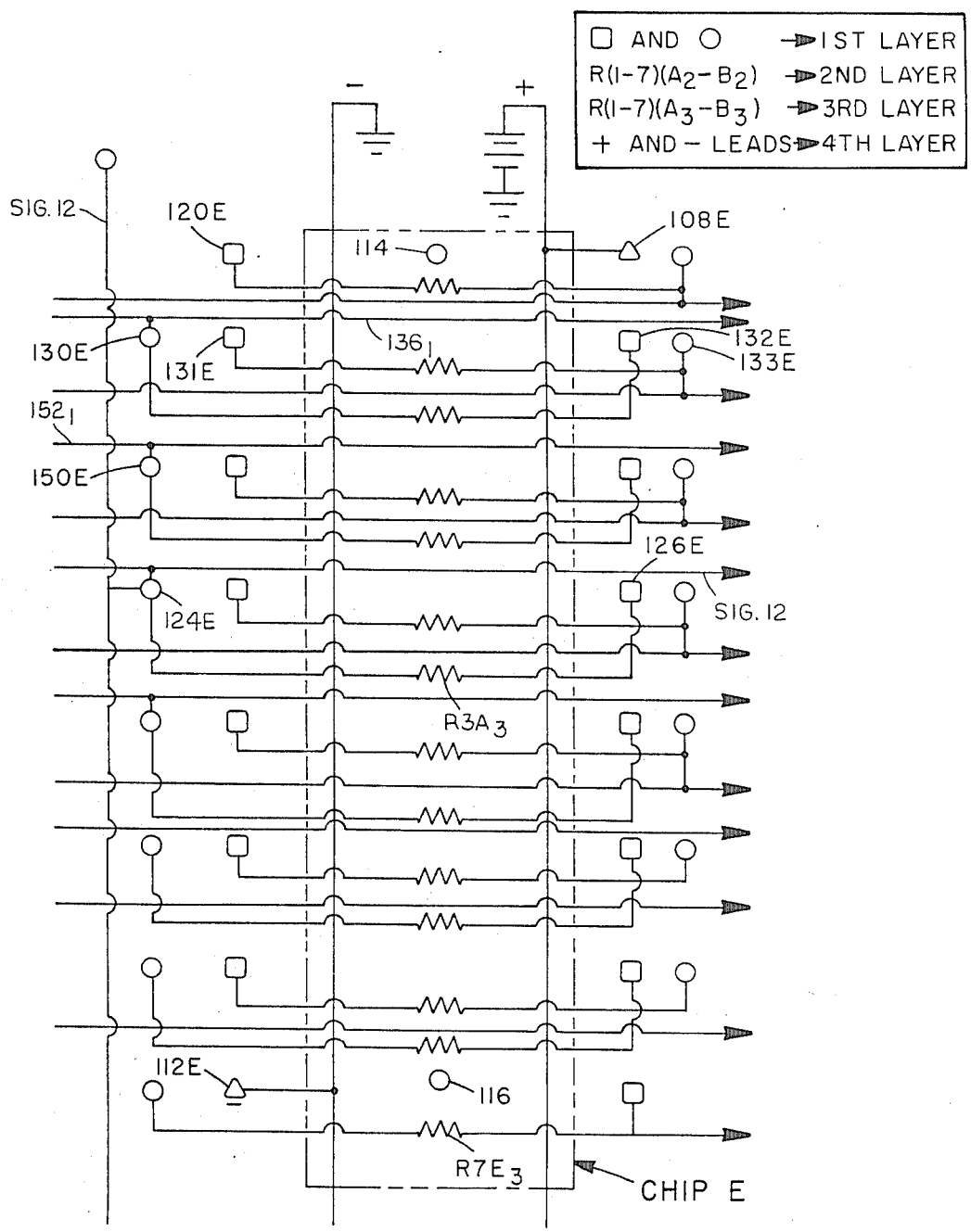

In FIG. 13 conductive traces, such as the seven conductive traces 188 in chip D, are formed on each of the areas of layer 2 which is dedicated to hold a chip socket and which along with layer 3 is formed before layers 1 and 4.

As will be recalled from the discussion of FIGS. 3 and 4, layer 2, and also layer 3, are formed from what was two adjacent levels, e.g. a level consisting of a continuous sheet of resistive material topped with a continuous coating, or level, of conductive material such as copper. The two adjacent levels are separated by a silicon (glass epoxy) based insulative layer as shown in FIGS. 2, 3, and 4.

Figure 14:
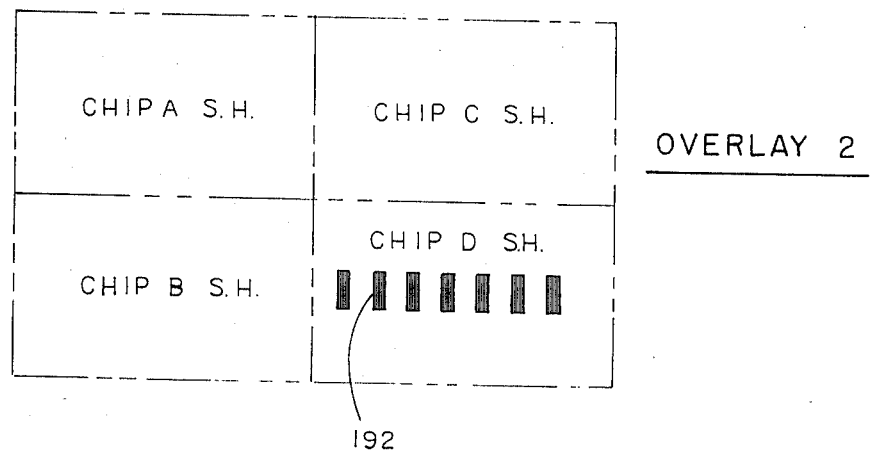
FIG. 14 shows a four chip, section of the overlay which is to used in forming the resistors of FIG. 13.
Figure 15:
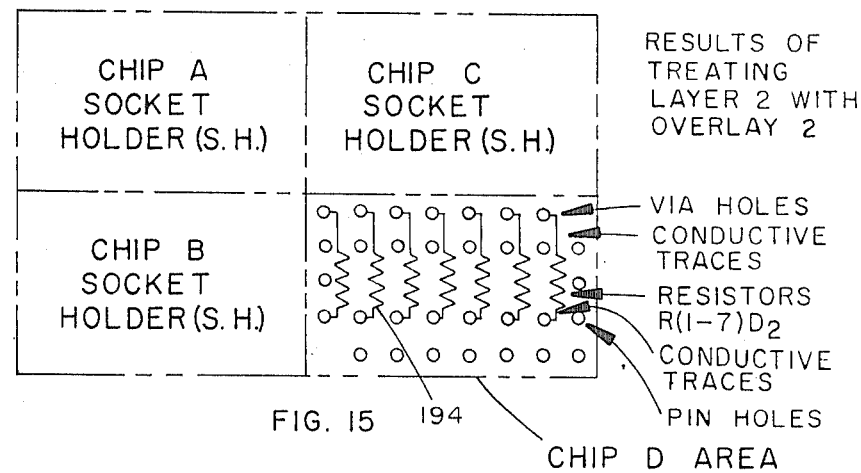
FIG. 15 shows the four chip circuit section of layer 2 after the resistors have been formed therein.

In FIG. 13 the block 190 represents an element 192 of the overlay negative of FIG. 14 which, when placed over the traces of layer 2, will result in the product or final form of layer 2 shown in FIG. 15 wherein the only active circuit elements remaining will be as shown in FIG. 15. More specifically, in FIG. 15 each of the seven original conductive traces 188 of FIG. 13 will now have a portion thereof replaced by a resistor, such as resistor 194. As can be seen from FIG. 15 there will be seven of such resistors which correspond to the seven resistors R(1-7) $D_2$ of FIGS. 5-10.

It should be that each of the seven resistors R (1-7) $D_2$ is connected between a via hole and a pin hole with the proper input signal of test signals (FIGS. 1-4) being applied to the via hole and then through a resistor to the pin hole and into the internal circuit of chip D. All of the area of the chip D socket holder (SH) of FIG. 15, other than the pin and via holes, the conductive traces, and the resistors R (1-7) $D_2$, is the subtrate of layers of FIG. 3.

The particular processes by which layer 2, as well as layer 3, is formed will be discussed later in the section hereof describing processes.

Layer 3 is formed in the same manner as layer 2, but on the opposite side of the substrate 92 of level 3 of FIG. 3. The process of forming the final layer 3 of FIG. 18 includes the steps of first forming the conductive traces of FIG. 16, followed by the forming of the elongated bar-like areas of negative overlay of FIG. 17 which are placed over the conductive traces, such as bar-like area 196 of FIG. 17 being placed over trace 198 (see also FIGS. 18 and 26) in the position of block 194.

Figure 18:
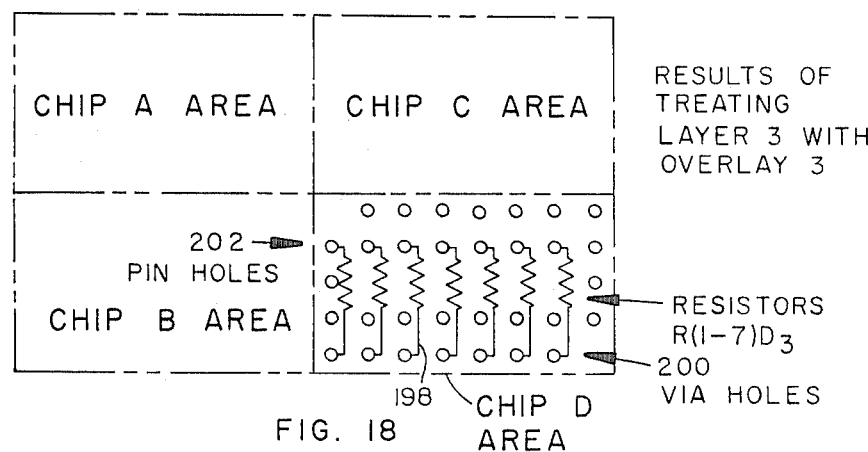

Next, by the proper processes to be described later the final form of layer 3 is formed as shown in FIG. 18, with the resistors R(1-7) $D_3$ being connected between via holes 200 and pin holes 202. The remainder of the surface area of the chip D.S.H. is the substrate material of layers of FIG. 3.

The next step in the process of forming the final PCB is the addition of levels 2 and 8 of FIG. 3 which are layers of insulative material such as glass epoxy.

Figure 19:
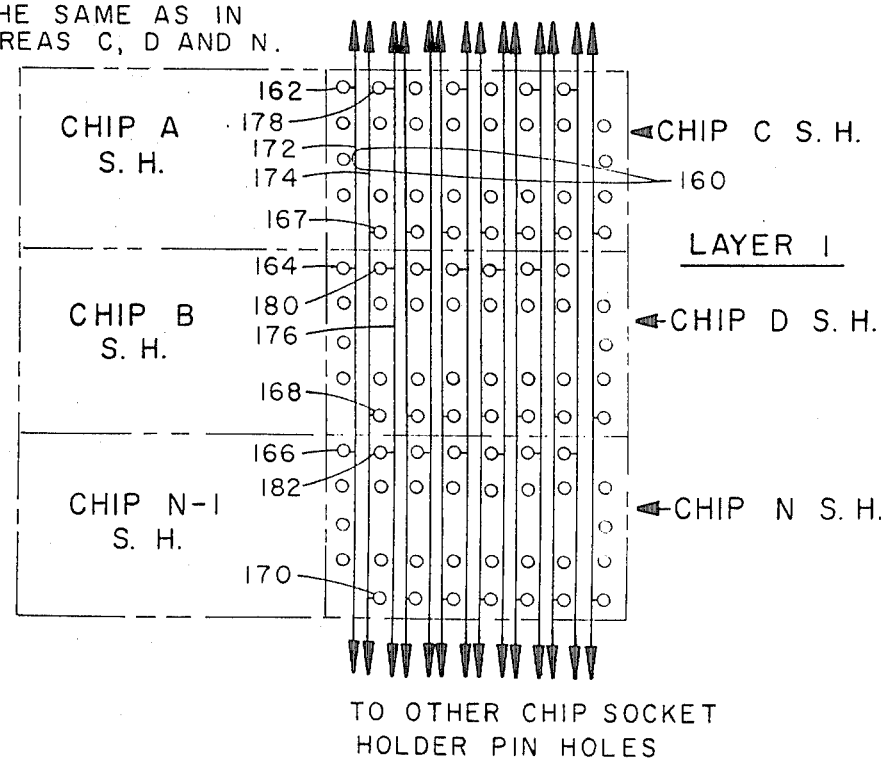
Figure 20:
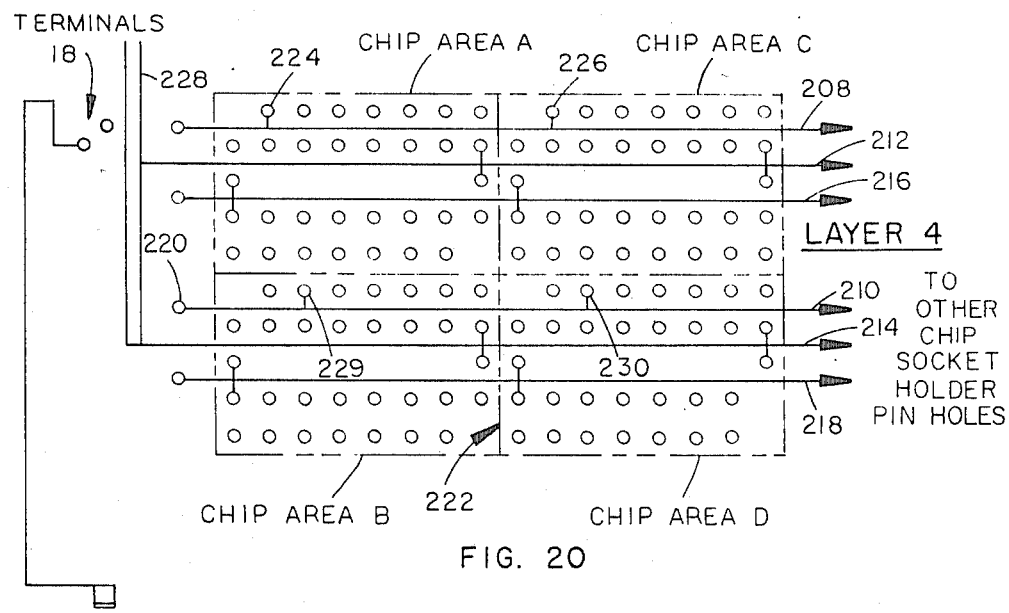

Layers 1 and 4 of FIG. 4, which are copper trace circuits as shown in FIGS. 19 and 20 are then formed on top of insulative levels 2 and 8 of FIG. 3. The copper trace circuits of FIGS. 19 and 20 are also shown in much more detail in FIGS. 21 and 22 for layer 1 and FIGS. 29 and 30 for layer 4.

It should be noted that FIGS. 21 thorugh 30 represent both ends of each of four layers of the finished product and include all of the PTHs which were all drilled and plated after the basic 4 layers of PCB were formed, as will be discussed in more detail later herein.

In. FIG. 19 layer 1 is shown to consist of a series of vertical conductive traces 160 which connect together corresponding via holes in each chip in each row of vertical via holes. As an example, conductive trace 172 connects together corresponding pin holes 162, 164, and 166 in chips C, D, and N. As other examples, trace 174 connects together pin holes 167, 168, and 170, and trace 176 connects together corresponding pin holes 178, 180, and 182.

In this manner all of the corresponding pin holes in all of the chips in the entire system are connected together, but only in the vertically shown direction by virtue of layer 1 of FIG. 19. As will be seen later in layer 4 of FIG. 20 similar connections for all corresponding pin holes in the horizontally shown direction are all connected together by separate horizontally shown traces.

The specific processes which produced the traces of layer 1 (originally a solid, continuous layer of copper will be discussed later herein under the section describing such processes. The pin holes and the via holes, although shown in FIG. 19, are not actually formed until all of the layers have been processed to form the proper conductive traces thereon and also the resistors on layers 2 and 3.

FIG. 20 shows a simplified form of 4 chip S.H. areas of layer 4 of the multilayered printed circuit board (MLPCB). It can be seen that layer 4 contains horizontally shown traces such as horizontally shown traces 208 and 210 which connect together the corresponding via holes such as via holes 224 and 226 in each row of via holes. Similarly, horizontally shown trace 210 connects together a different set of corresponding via holes, such as via holes 228 and 230 in the chip SH areas B and D.

In this manner, each of the 14 via holes in each of the chips are connected together by separate horizontal traces. When combined with the vertical traces of FIG. 19 of layer 1, it can be seen that the corresponding via holes of all of the chip SH areas are connected together so that the aforementioned 14 signal inputs (FIG (1-14) will be required to supply the same input signal to each of corresponding 14 via holes of each chip SH area and which will then pass through a resistor and into the chip circuitry.

DETAILED DESCRIPTION OF THE PROCESS OR PROCESSES BY WHICH EACH OF LAYERS 1-4 ARE FORMED

1-Process for Forming Layers 2 and 3

Since layers 1 and 2 are formed by exactly the same processes as layers 3 and 4, only the processes with respect to layers 1 and 2 will be described.

It is apparent that layer 2 of FIG. 15 must be formed before layer 1 of FIG. 19 can be formed.

In forming layer 2 the following steps are taken in the order listed:

a—The surface of the copper layer 50 of FIG. 2 is coated with a negative photoresist (not shown) which means will polymerize and harden to resist washing off. The portions of the photoresist not exposed to light will wash off in an aqueous bath of alkaline material.

b—The layer of photoresist is exposed to light through a photographic negative having an image pattern thereon which will produce hardened portions of the photoresist in accordance with the traces and hole locations of FIG. 13 (including the seven blocks such as block 190 where resistors are to be formed.) The remainder of the photoresist will not harden.

c—The entire panel is then bathed in a mild etching solution, which can be an alkaline solution or other type solution depending on the photoresist used, to remove the non-hardened photoresist.

d—Then the exposed copper and resistive material is removed in another strong etching solution which does not attack the hardened photoresist.

e—Next, the hardened photoresist is removed by bathing it in a stronger base solution to strip away the hardened photoresist, leaving only the fine copper traces previously covered by the hardened photoresist and the resistive layer under the copper tracings.

f—The surface of copper layer 50 is coated with a second coating of photoresist.

g—Next the board of FIG. 2 is exposed to a second photographic image, e.g. the overlayer of FIG. 14 which covers that part of copper traces under the blocks such as block 190 in FIG. 13 which is formed by covering the area within the block 190 by the dark area 192 of FIG. 14. The non-hardened resist which lay under the overlay is developed of the board as was previously described.

h—The surfaces of the PCB of FIG. 2 is then bathed in a solution of chrome sulphuric which will remove the copper tracing lying within the block 190 of FIG. 13 leaving the resistor 194 of FIG. 15 underneath.

i—In this manner the resistors $R(1-7)D_2$ of the chip D area of FIG. 15 are formed, as well as all the other resistors in each of the many chip SH areas.

Figure 16:
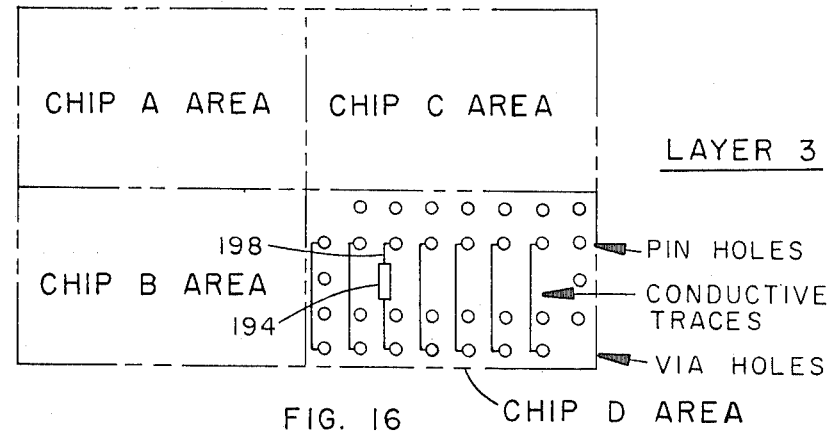
FIGS. 16, 17, and 18 show, respectively, a four chip circuit section of layer 3 before the resistors have been formed therein, the overlayer which is used with FIG. 16 to show a four chip circuit section of the final form of layer 3 with the resistors formed therein.
Figure 17:
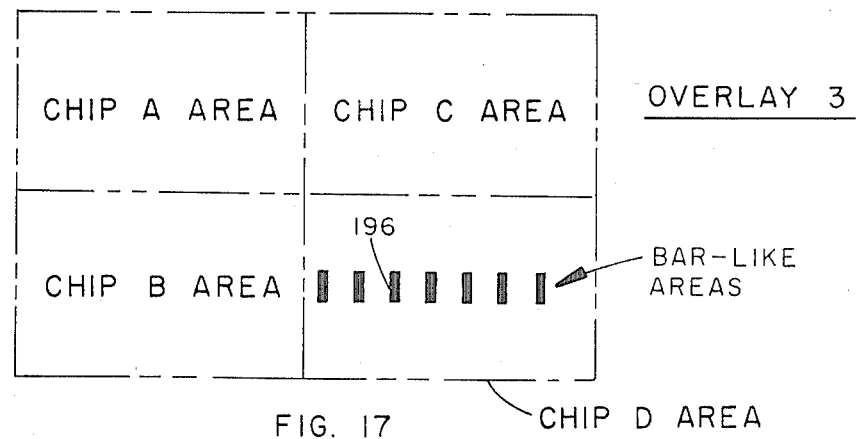

It should be noted that the formation of the resistor 191 is in layer 2 whereas FIGS. 16, 17, and 18 relate to the formation of resistors in layer 3 using precisely the method as described with respect to the formation of the resistors of layer 2.

Figure 24:
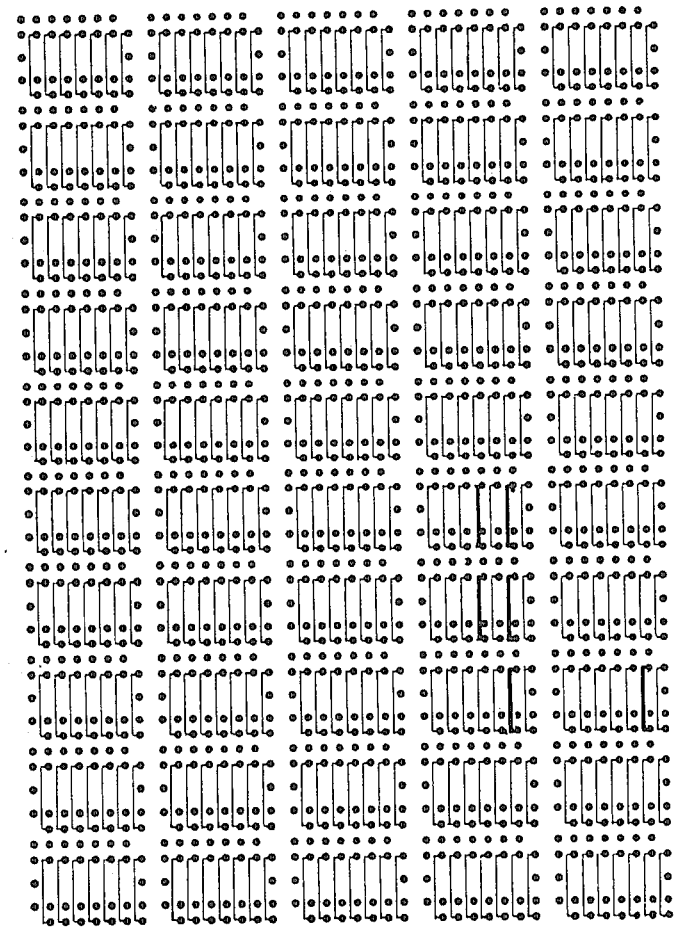
Figure 25:
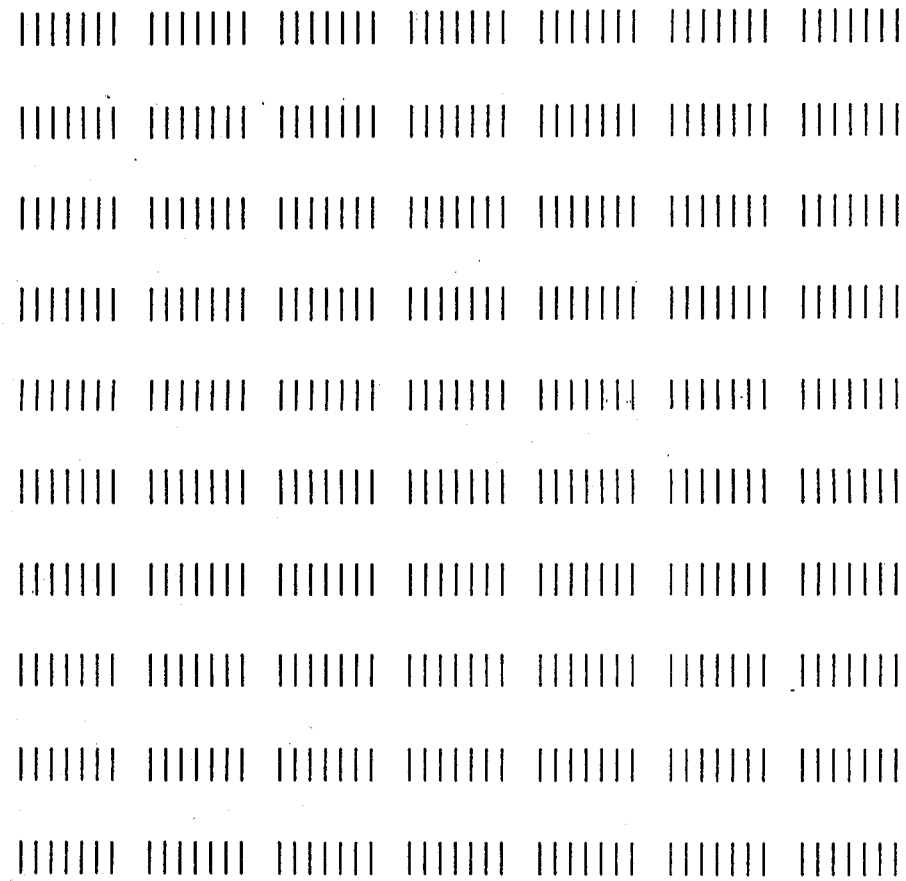
FIG. 25 shows all vertical level levels of the overlay used in layer 2.
Figure 26:
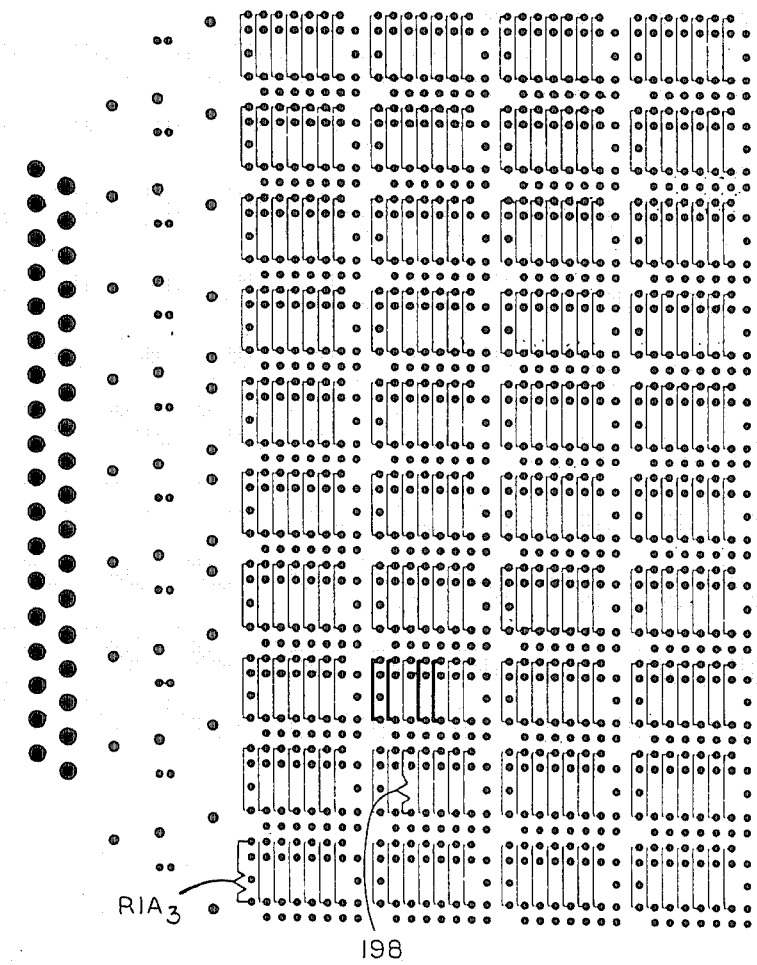
FIGS. 26 and 27 show the two end portions of layer 3 of the finished product.
Figure 27:
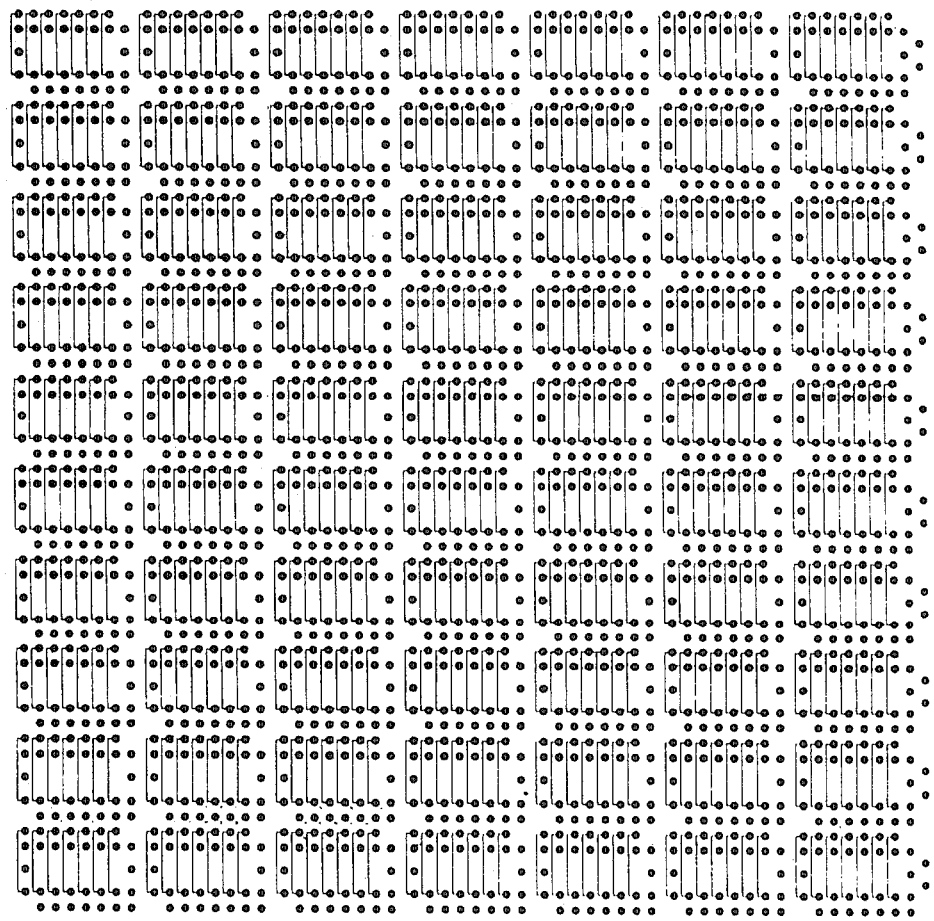
Figure 28:
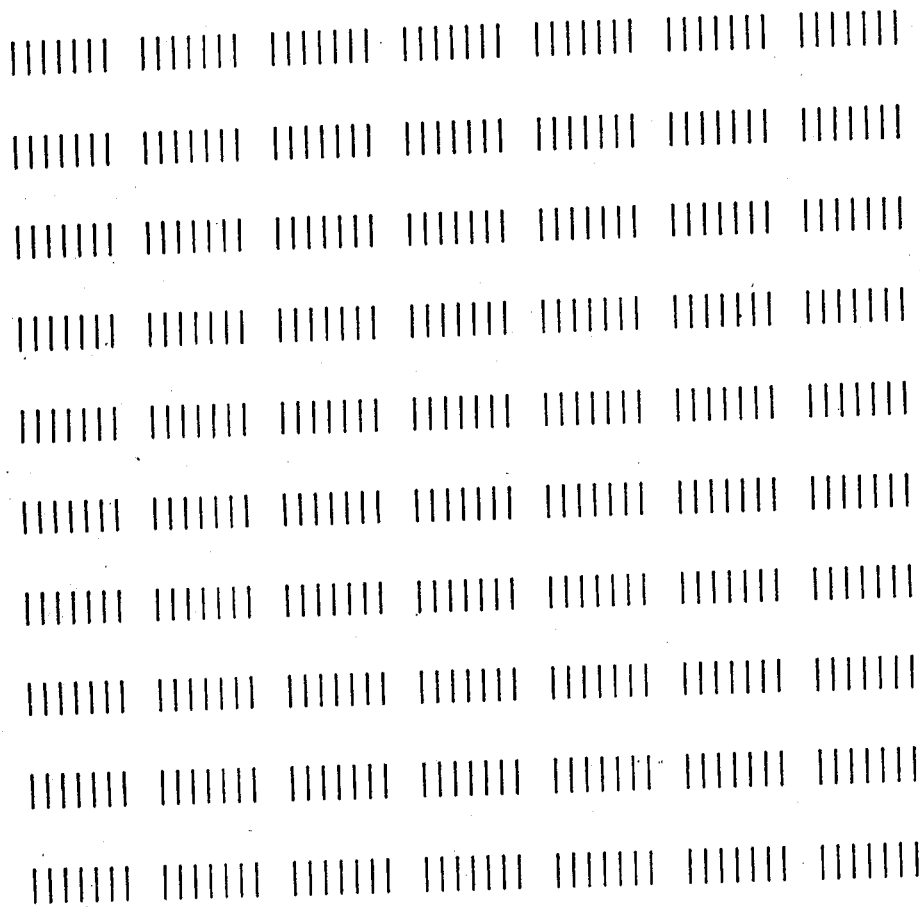
FIG. 28 shows all vertical levels of the overlay used in forming the resistors of layer 3.

It should also be noted that much more comprehensive views of layers 2 and 3 are shown in the four FIGS. 23, 24, and 26, and 27, with FIGS. 23 and 24 representing the two extreme opposite ends of layer 2 and FIGS. 26 and 27 representing the two extreme opposite ends of layer 3. In FIGS. 23 and 24 the card edge ends connectors of layers 2 and 3 are shown. Such card ends will be better understood from the following discussion of the formation of layers 1 and 4.

It should further be noted that few reference characters are employed in FIGS. 23, 24, 26, and 27 since they are merely extensions of FIGS. 13, 14, and 15, which have already been discussed in detail.

It should further be noted that the foregoing is only one method of forming the resistors. They may be formed by screen printing and curing conductive inks or any other suitable means.

2-Process For Forming Layers 1 and 4

Figure 21:
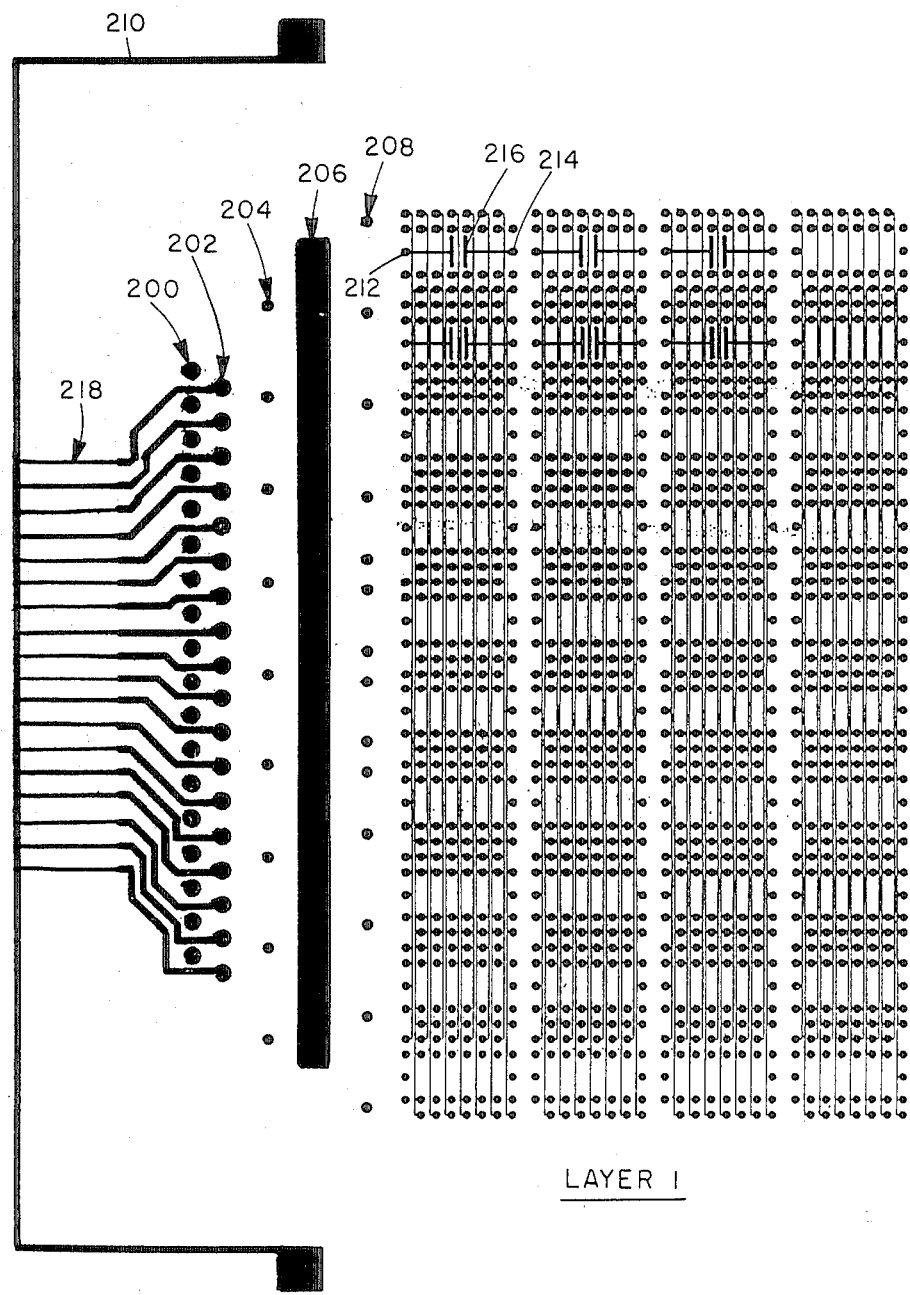
FIGS. 21 and 22 show the two end portions of layer 1 of the finished product.
Figure 22:
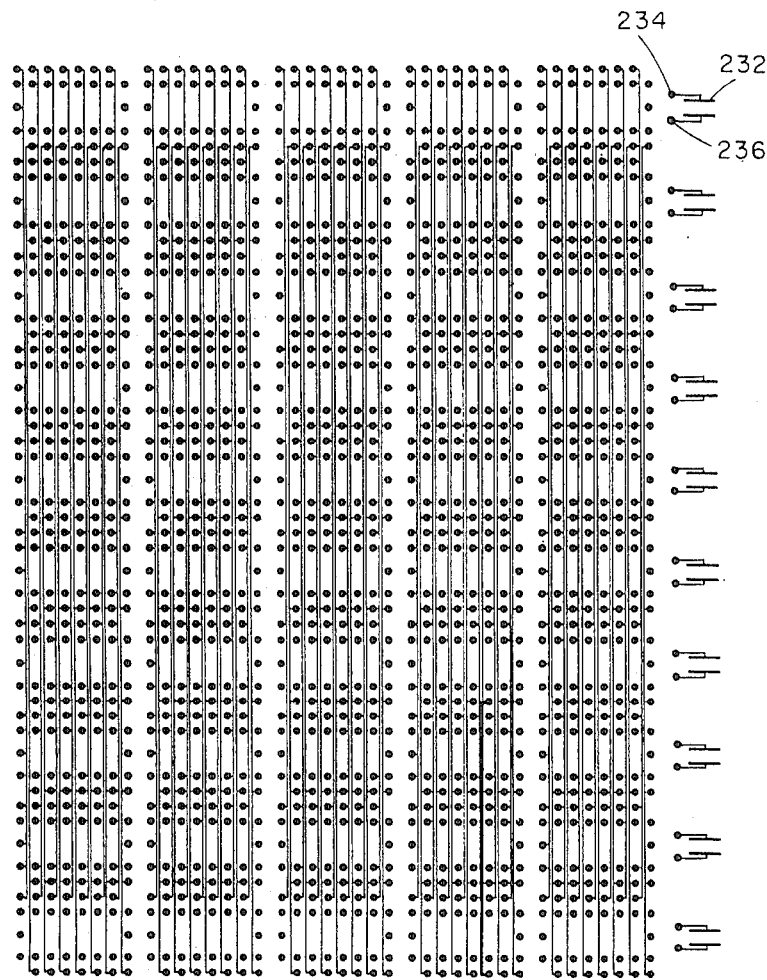

To form layers 1 and 4 it is necessary to perform the following steps:

a—Add a glass cloth preimpregnated with polyimide, epoxy resin or other suitable insulative materials on the surfaces of both of the finished layers 2 and 3.

b—Place a copper foil over the cloth pre-impregnated with polyimide resin on both sides of the PCB and then apply heat of 300°-500° F. under 300-400 PSI presure for about one hour to bond the resulting laminates securely together.

c—The various holes shown in the FIGS. 21—30 and in detail in FIGS. 21 and 22 of layer 1 are then drilled through the entire PCB.

d—Coat the interior of the drilled holes and the entire surfaces of layers 1 and 4 with electroless copper by a form of deposition to begin the formation of the plating of the PTH's.

e—Roll laminate a layer of photoresist over the entire copper surfaces of layers 1 and 4, but bridging over the holes.

f—Next the photoresist layers on layers 1 and 4 are exposed to imaging thorugh a photographic negative which causes the photoresist over those positions of layers 1 and 4 which are not to become copper traces or hole areas to become hardened.

g—The photoresist is then developed off the unexposed areas to expose the desired copper traces and the areas around the holes. The hardened photoresist remains on the surfaces of layers 1 and 4.

h—the now exposed copper traces and the hole areas including the interior walls of the holes are next electroplated with additional copper to build up the thickness of the copper. The portions of the surfaces of layers 1 and 4 covered by the hardened photoresist prevents any copper from depositing thereon.

i—The PCB is then dipped in a strong base material such as sodium carbonate which will remove all of the hardened photoresist. Next the etchant will remove some of the copper on the copper traces and the hole areas as well as all of the copper foil layer down to the insulative material but sufficient additional copper had been built up on these areas so that the etchant does not remove all of the copper and enough of it remains to form adequate conductive paths. Alternatively a metallic etch resist may have been electroplated after the copper but before the photoresist was removed.

j—The copper tracings and hole areas on the card edge portion of layers 1 and 4 (FIGS. 21 and 30) are plated with gold to form a lubricated type contact surface.

DETAILED DESCRIPTION OF FIGS. 21-30

FIGS. 21-30 show details of each of the four layers of the finished PCB. It is to be understood that only the groups of socket holes comprising a part only of the ends of each layer are shown because the entire PCB is too long to show in a single drawing with sufficient detail.

Of particular interest in FIG. 21, which shows the card end edge of layer 1 of the PCB, is the double row of large holes 200 and 202 which are connected individually through the finger like traces 218 to the edge 210 of the PCB. The solid vertical negative copper bus bar 206 of FIG. 21 covers a vertical row of PTH's 220 as shown in FIG. 20 (as they would appear on layer 1 if not covered by the vertical bar 206) and carries the negative or ground potential through to the horizontal ground power bus bars of layer 4, such as bus bar 224 of FIG. 20.

Figure 29:
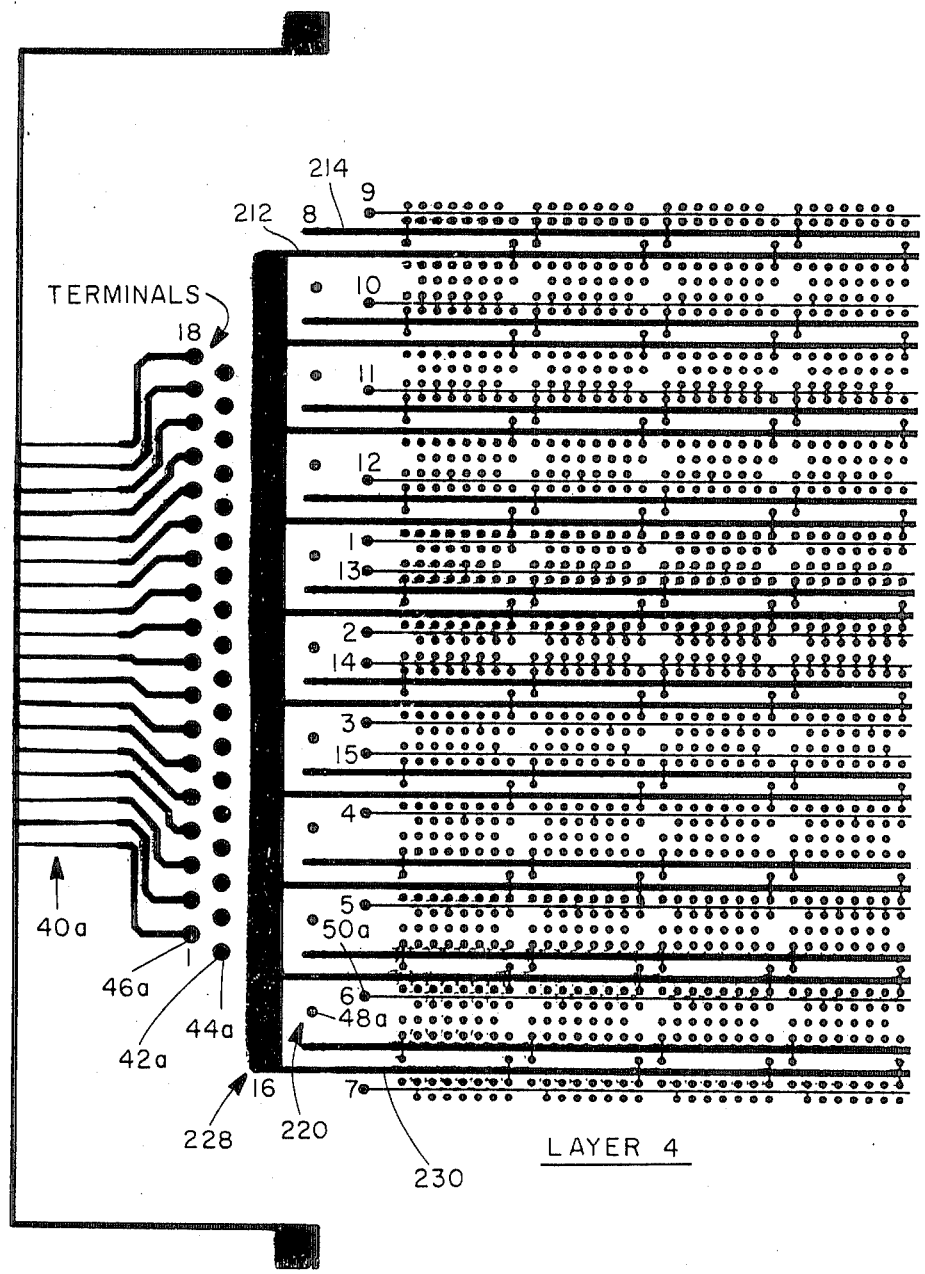
FIGS. 29 and 30 show the two end portions of layer 4 of the finished product.

The vertical row of holes 204 in FIG. 21 carry the positive voltage source from selected holes of holes 200 and 202 of FIG. 21 to the solid vertical bus bar 228 of FIG. 29 of layer 4 which in turn is connected to the positive horizontal bus bars of FIG. 29 such as bus bar 230.

In each of the groups of chip SH's there are two PTH holes such as holes 212 and 214 at the upper left hand corner of FIG. 21 and to which the negative and positive buses are connected as shown in layer 4 (FIG. 29). Between each pair of such two holes 212 and 214 a capacitor 216 is connected, as is also shown in chip C of FIGS. 7 and 29.

Figure 30:
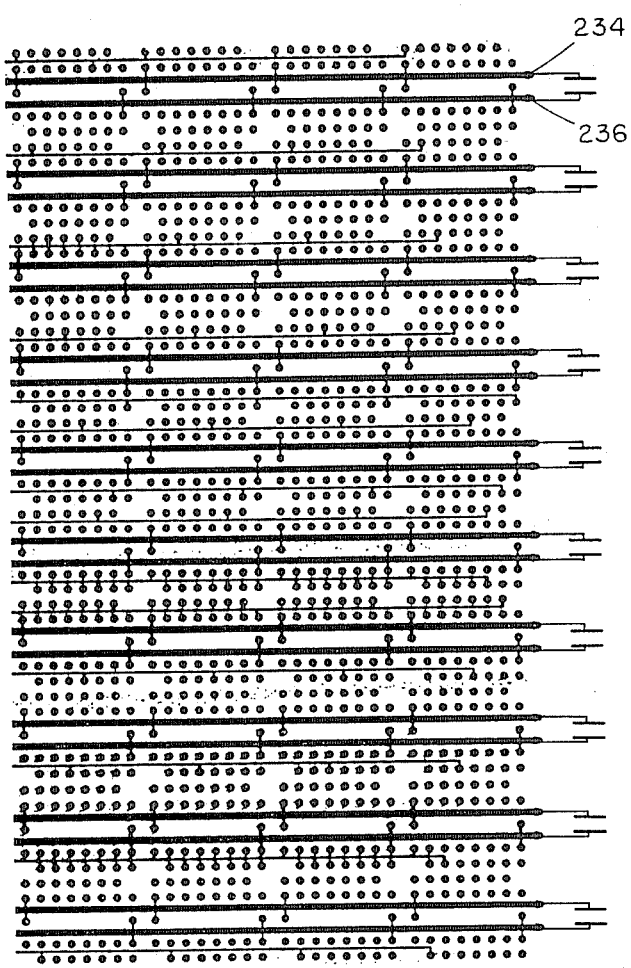

Similarly, capacitors, such as capacitor 232 are connected between holes 234 and 236 in layer 1 (FIG. 22). Holes 234 and 236 constitute the ends of the negative and positive power buses 224 and 230 of layer 4 (FIG. 30).

The vertical columns of 14 PTH's 208 in FIG. 21, layer 1, constitute the signal inputs for FIGS. 1–14 as shown in FIGS. 5–10 and 12. The column of holes 208 are connected to specified ones of the double rows of heavy holes 200 and 202 of FIG. 21 by appropriate connections.

It is to be noted that the above described form of the invention is but a preferred embodiment thereof and that a person of ordinary skill in the art could design other embodiments thereof without departing from the spirit or scope of the invention as defined in the appended claims.

What is claimed is:

1. An improved apparatus for stress testing a plurality of electronic circuits each formed on a wafer-like chip with contacts along at least one edge thereof and each comprising:
    a separate socket comprising a set of sockets for receiving and holding one of said wafer-like chips with the set of contacts making contact with the edge contacts of the wafer-like chip it is holding and a plurality of terminal pins which are connected to said edge contacts of said wafer-like chips through said set of contacts
    the terminal pins of each socket being arranged in identical patterns;
    a multilayered printed circuit board (MLPCB) having a top layer, a bottom layer, and at least one inner layer all bonded together with each layer comprised of glass fibers and polymers and having a plurality of identical groups of correspondingly positioned conductively plated-through-holes (PTH's) formed therein for each socket and with each group of PTH's comprising a first plurality of correspondingly positioned pin terminal holes arranged to receive the terminal pins of each one of said sockets and a second plurality of correspondingly positioned via holes formed therein around each socket to provide conduction between layers of said MLPCB for each socket;
    a plurality of printed circuit resistors formed on one or more inner layers of said MLPCB with each resistor being connected between a pin terminal hole and a via hole of the group of holes of each socket and exclusive of any other pin terminal hole or via hole with respect to connecting a resistor therebetween;
    a plurality of conductive means for connecting together the correspondingly positioned via holes of each of said sockets;
    a plurality of signal sources for supplying a unique signal to each group of corresponding via holes via a unique one of said conductive means; and
    means for providing positive and ground voltage supply networks from a common voltage source on separate selected layers of said MLPCB between selected ones of said PTH's of each socket.

2. An improved apparatus for testing a plurality of H identical groups of N circuits with each of said N circuits having first and second power inputs and each contained in a separate container with each group of N circuits having a plurality of Q terminal pins, respectively, extending out of the container containing said N circuits and with each of said pluralities of terminal pins being arranged in first identical patterns, and comprising:
    a multilayered printed circuit board (MLPCB) having a top layer, a bottom layer, and at least one inner layer all bonded together and comprising printed circuit paths on each layer of said MLPCB;
    said MLPCB further comprising:
        H groups of Q and R groups of plated through holes (PTH's), with each H group of PTH's formed in second identical patterns and with each group of Q PTH's comprising a first plurality of groups of Q terminal pin receiving PTH's arranged in said first identical pattern to receive one of said groups of Q terminal pins and a second plurality of R via PTH's arranged in a third identical pattern formed therethrough;
        H groups of T corresponding resistors, one group for each group of N circuits, formed on one or more selected inner layers of said MLPCB with each resistor having a first and second terminal;
        the first terminal of each individual resistor of each group of resistors being connected to a corresponding, selected PTH via of one of said groups of via PTH's and the second terminal of said individual resistor being connected to a selected one of said pin terminal PTH's of said one of said groups of pin terminal PTH's;
        circuit means for connecting the corresponding via PTH of each plurality of R via PTH's to a common terminal;
        power supply means having positive and negative voltage terminals; and
        first and second circuit networks for supplying said first and second voltages of said power suppy means to the first and second power inputs of each of said N circuits on different layers of the MLPCB.

3. An improved apparatus as in claim 2 and further comprising means for supplying a separate, predetermined signal to each of said common terminals.

4. An improved apparatus as in claim 2 in which corresponding resistors have values different from values of the corresponding resistors of other, selected groups of said resistors.

5. An improved apparatus as in claim 2 in which resistors of each group of resistors can have a value different from that of any other resistor of said each group of R resistors.

6. An improved apparatus for stress testing with a test current of predetermined magnitude a plurality of circuits in a plurality of IC chips with each IC chip having contacts along at least one edge thereof and comprising first and second power supply input terminals and further comprising:
    a separate chip holding socket comprising at least one row of contacts which make contact with the edge contacts of the chip it is holding and a plurality of terminal pins which are connected to said edge contacts of said chip through said at least one row of contacts;
    a multilayered printed circuit board (MLPCB) comprised of silicate fibers and polymers and having a plurality of groups of identically arranged plated through holes (PTH's), with each group of PTH's being comprised of first and second pluralities of PTH's with each of said first and second pluralities of each group of PTH's being identically arranged and further with said first plurality of PTH's in each group of PTH's being arranged to receive the terminal pins of one of said sockets;

a plurality of current limiting resistors for limiting the test current flowing through the said IC chip circuits with each of said current limiting resistors being printed on one or more inner layers of said MLPCB;

means for connecting together to a common terminal the corresponding PTH's in each of said second pluralities of PTH's in each group of PTH's;

a power supply having negative and positive terminals;

first network means on a first layer of said MLPCB for supplying the voltage on a first terminal of said power supply to the first power supply input terminal of each of said plurality of circuits and second network means on a second layer of said MLPCB for supplying the voltage on the second terminal of said power supply to the second power supply input terminal of said IC chips through a plurality of selected PTH's; and means for providing the proper impedance termination of said positive and negative voltage carrying networks through selected ones of said PTH's.

7. An improved apparatus as in claim 6 and further comprising means for supplying a separate, predetermined signal to each of said common terminals.

8. An improved apparatus as in claim 6 comprising a group of corresponding resistors for each IC chip and in which corresponding resistors of selected groups of said resistors have values different from those of the corresponding resistors of other selected groups of said resistors.

9. An improved apparatus as in claim 6 in which each resistor of said plurality of current limiting resistors can have a value different from that of any other resistor of said plurality of current limiting resistors.

* * * * *